United States Patent
Lee et al.

(10) Patent No.: US 7,585,113 B2
(45) Date of Patent: Sep. 8, 2009

(54) MICRO-ELECTRO MECHANICAL SYSTEMS SWITCH AND METHOD OF FABRICATING THE SAME

(75) Inventors: Jae Woo Lee, Daejeon (KR); Chang Han Je, Gyeongsangnam-do (KR); Sung Weon Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/440,863

(22) Filed: May 24, 2006

(65) Prior Publication Data

US 2007/0170460 A1 Jul. 26, 2007

(30) Foreign Application Priority Data

Dec. 8, 2005 (KR) .................. 10-2005-0120187

(51) Int. Cl.
*G02B 6/00* (2006.01)
(52) U.S. Cl. .................. 384/147; 430/311
(58) Field of Classification Search ......... 359/196, 359/227, 362, 838; 385/15–17; 333/105, 333/262; 335/78
See application file for complete search history.

(56) References Cited

U.S. PATENT DOCUMENTS

| | | | | |
|---|---|---|---|---|
| 5,479,042 | A * | 12/1995 | James et al. ............... | 257/415 |
| 5,578,976 | A | 11/1996 | Yao | |
| 6,307,452 | B1 * | 10/2001 | Sun ........................... | 333/262 |
| 6,411,754 | B1 * | 6/2002 | Akkaraju et al. .......... | 385/22 |
| 6,426,687 | B1 * | 7/2002 | Osborn ...................... | 333/262 |
| 6,452,124 | B1 * | 9/2002 | York et al. ................. | 200/181 |
| 6,465,929 | B1 * | 10/2002 | Levitan et al. ............. | 310/309 |
| 6,489,857 | B2 * | 12/2002 | Petrarca et al. ............ | 333/105 |
| 6,496,351 | B2 * | 12/2002 | Hill et al. ................... | 361/278 |
| 6,535,091 | B2 * | 3/2003 | Bechtel et al. .............. | 333/262 |
| 6,538,798 | B2 * | 3/2003 | Miller et al. ............... | 359/291 |
| 6,587,021 | B1 * | 7/2003 | Streeter ...................... | 333/262 |
| 6,621,022 | B1 * | 9/2003 | Ma et al. .................... | 200/267 |
| 6,621,387 | B1 * | 9/2003 | Hopcroft .................... | 333/262 |
| 6,646,215 | B1 * | 11/2003 | Nelson ....................... | 200/181 |
| 6,657,525 | B1 * | 12/2003 | Dickens et al. ............. | 335/78 |
| 6,657,832 | B2 * | 12/2003 | Williams et al. ............ | 361/15 |
| 6,686,820 | B1 * | 2/2004 | Ma et al. .................... | 333/262 |
| 6,713,695 | B2 * | 3/2004 | Kawai et al. ............... | 200/181 |

(Continued)

OTHER PUBLICATIONS

Daniel Hyman et al., "Surface-Micromachined RF MEMs Switches on GaAs Substrates", 1999 John Wiley & Sons, Inc., CCC 1096-4290 99 040348-14; Jan. 5, 1999; pp. 348-361.

(Continued)

*Primary Examiner*—Frank G Font
*Assistant Examiner*—Peter Radkowski
(74) *Attorney, Agent, or Firm*—Blakely, Sokoloff, Taylor & Zafman LLP (57) ABSTRACT

A MEMS switch and a method of manufacturing the same are disclosed. The MEMS switch includes: a substrate including a trench, a ground line and a signal line having an opened portion; a moving plate separated from the substrate at a predetermined space and including a contact member for connecting an electrode plate and the opened portion and having a deep corrugate to insert the trench; and a supporting member for supporting the moving plate. Such a MEMS switch prevents the thermal expansion and the stiction problem.

18 Claims, 12 Drawing Sheets

U.S. PATENT DOCUMENTS

| | | | |
|---|---|---|---|
| 6,731,492 B2 * | 5/2004 | Goodwin-Johansson | 361/233 |
| 6,744,338 B2 * | 6/2004 | Nikitin | 333/262 |
| 6,750,742 B2 * | 6/2004 | Kang et al. | 333/262 |
| 6,787,438 B1 * | 9/2004 | Nelson | 438/584 |
| 6,791,235 B2 * | 9/2004 | Miller et al. | 310/311 |
| 6,806,545 B2 * | 10/2004 | Shim | 257/420 |
| 6,815,739 B2 * | 11/2004 | Huff et al. | 257/275 |
| 6,822,304 B1 * | 11/2004 | Honer | 257/418 |
| 6,872,902 B2 * | 3/2005 | Cohn et al. | 200/181 |
| 6,876,283 B1 * | 4/2005 | Weber et al. | 335/78 |
| 6,876,482 B2 * | 4/2005 | DeReus | 359/290 |
| 6,917,268 B2 * | 7/2005 | Deligianni et al. | 335/78 |
| 6,919,784 B2 * | 7/2005 | Feng et al. | 335/78 |
| 6,960,971 B2 * | 11/2005 | Park et al. | 333/262 |
| 7,027,284 B2 * | 4/2006 | Kobayashi et al. | 361/278 |
| 7,053,737 B2 * | 5/2006 | Schwartz et al. | 335/78 |
| 7,198,973 B2 * | 4/2007 | Lin et al. | 438/48 |
| 7,250,315 B2 * | 7/2007 | Miles | 438/29 |
| 7,256,670 B2 * | 8/2007 | Jahnes et al. | 335/78 |
| 7,256,922 B2 * | 8/2007 | Chui et al. | 359/245 |
| 7,355,780 B2 * | 4/2008 | Chui et al. | 359/290 |
| 7,372,619 B2 * | 5/2008 | Miles | 359/291 |
| 7,385,744 B2 * | 6/2008 | Kogut et al. | 359/198 |
| 7,414,500 B2 * | 8/2008 | De Los Santos | 335/78 |
| 7,429,334 B2 * | 9/2008 | Tung et al. | 216/24 |
| 2002/0048422 A1 * | 4/2002 | Cotteverte et al. | 385/4 |
| 2003/0227361 A1 * | 12/2003 | Dickens et al. | 335/78 |
| 2004/0108195 A1 * | 6/2004 | D'Amico et al. | 200/600 |
| 2004/0157364 A1 * | 8/2004 | Combi et al. | 438/106 |
| 2005/0139577 A1 * | 6/2005 | Kim et al. | 216/41 |
| 2005/0140478 A1 * | 6/2005 | Lee et al. | 335/78 |
| 2005/0178646 A1 * | 8/2005 | De Los Santos | 200/181 |
| 2006/0171628 A1 | 8/2006 | Naniwada | |

OTHER PUBLICATIONS

R.E. Mihailovich et al., "MEM Relay for Reconfigurable RF Circuits", IEEE Microwave and Wireless Components Letters, vol. 11, No. 2, Feb. 2001, pp. 53-55.

* cited by examiner

MICRO-ELECTRO MECHANICAL SYSTEMS SWITCH AND METHOD OF FABRICATING THE SAME

CROSS-REFERENCE TO RELATED PATENT APPLICATION

This application claims the benefit of Korean Patent Application No. 10-2005-0120187, filed on Dec. 8, 2005, in the Korean Intellectual Property Office, the disclosure of which is incorporated herein in its entirety by reference.

BACKGROUND OF THE INVENTION

1. Field of the Invention

The present invention relates to a switch for controlling a flow of a signal in a high frequency band wireless communication system or a radio frequency system, and more particularly, to a micro-electro mechanical systems (MEMS) switch driven by an electrostatic force.

2. Description of the Related Art

A field effect transistor (FET) and a pin diode are generally used as a switching element to control a flow of a signal in a high frequency band communication system. However, such a semiconductor switch has high insertion loss and low signal isolation loss although the semiconductor switch has a high degree of integration. Also, the semiconductor switch is a non-linear element that causes signal distortion. In order to overcome such drawbacks of the semiconductor switch, a micro-electro mechanical systems (MEMS) switch was introduced.

The MEMS switch generally includes a moving part that relatively moves with respect to a fixed substrate and a driving part for driving the moving part. The driving part includes two electrodes facing one another. The moving part is driven by electrostatic force generated by voltage supplied from the electrodes of the driving part. That is, the moving part moves horizontally or vertically to the substrate, or rotates about the substrate at a predetermined angle.

Figure 1A:
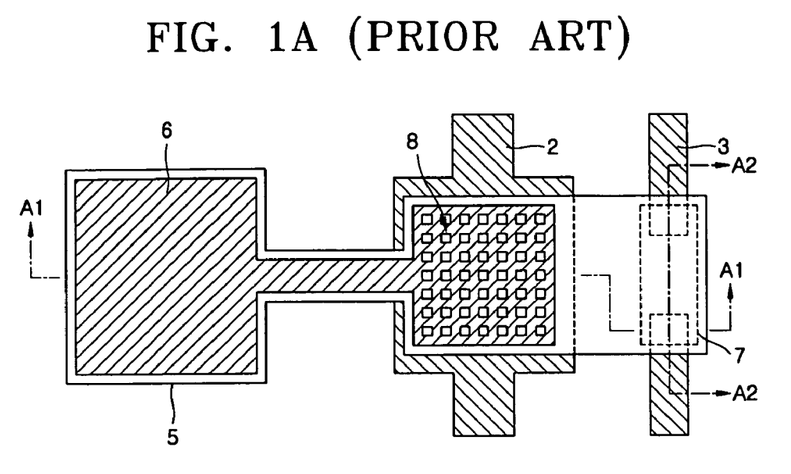
FIG. 1A is a plan view of a conventional MEMS switch having a cantilever structure.

FIG. 1A is a plan view of a conventional MEMS switch having a cantilever structure.

Referring to FIG. 1A, the conventional MEMS switch having a cantilever structure includes a substrate (not shown) having a bottom electrode 2, a signal line 3 and a supporting member (not shown), and a cantilever arm 5 having an one end fixed at the substrate to be spaced apart from the bottom electrode 2 and the signal line 3 by a predetermined distance. A top electrode 6 is formed on the cantilever arm 5 and a contact member 7 connecting the signal line 3 is formed on a bottom of other end of the cantilever arm 5. A middle portion of the cantilever arm 5 and the top electrode 6 is formed to be narrower than other portions so that the other end of the cantilever arm 5 has a predetermined level of elastic force. As shown in FIG. 1A, the conventional MEMS switch includes a capacitor structure portion 8 formed of a plurality of small rectangles which are holes to eliminate a sacrificial layer that was formed on a bottom of the cantilever arm 5.

Figure 1B:
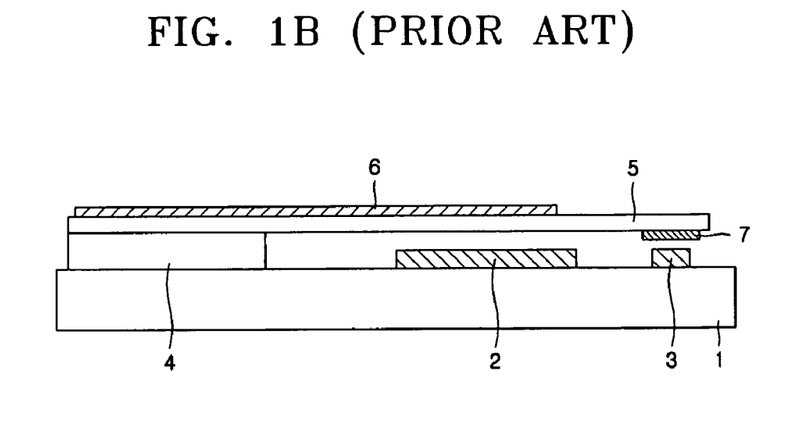
FIG. 1B is a cross-sectional view of FIG. 1 taken along a line A1-A1.

FIG. 1B is a cross-sectional view of FIG. 1 taken along a line A1-A1.

As shown in FIG. 1B, the cantilever arm 5 is apart from the bottom electrode and the signal line 3 at a predetermined gap because the thickness of the supporting member 4 formed on a left side of the substrate 1 is thicker than the bottom electrode 2 and the signal line 3. The contact member 7 is formed on the bottom of other end of the cantilever arm 5.

When a predetermined level of voltage is applied to the top electrode 6 and the bottom electrode 2, the electrostatic force is generated from the capacitor structure portion 8 formed by the overlapping of the top electrode 6 and the bottom electrode 2. Then, the electrostatic force bends the cantilever arm 5 in a bottom direction. Therefore, the contact member 7 connects the signal lines 3 to perform a switching operation. Such a conventional MEMS switch having the cantilever arm structure is disclosed in U.S. Pat. No. 5,578,976 (Nov. 26, 1996).

Figure 2A:
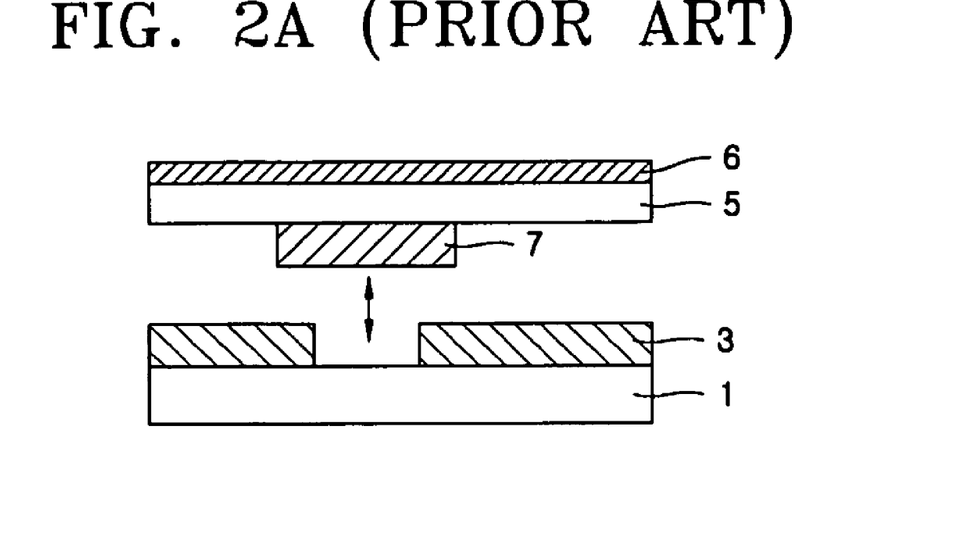
FIGS. 2A and 2B are cross-sectional views of the conventional MEMS switch shown in FIG. 1A taken along the line A2-A2 for describing operations of the conventional MEMS switch having the cantilever arm structure.
Figure 2B:
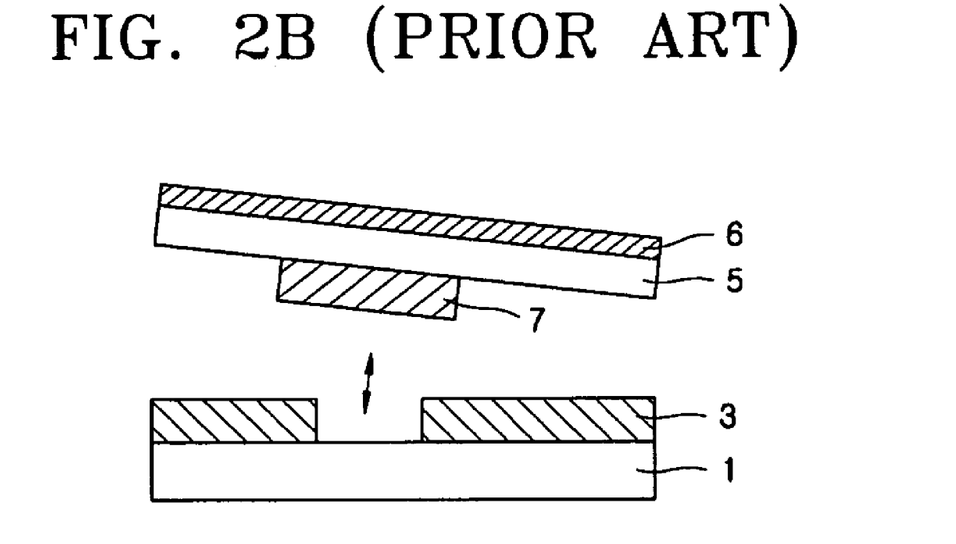

FIGS. 2A and 2B are cross-sectional views of the conventional MEMS switch shown in FIG. 1A taken along the line A2-A2 for describing operations of the conventional MEMS switch having the cantilever arm structure.

FIG. 2A shows the cantilever arm 5 with the contact member 7 of the conventional MEMS switch, which is operated in a normal state. That is, the cantilever arm 5 maintains to be parallel from the signal line 3 while moving upwardly and downwardly as shown in FIG. 2A. Although the signal line 3 connected to an input unit (not shown) and an output unit (not shown) and the contact member 7 are disposed to be parallel one another, the only one end of the cantilever arm 5 is supported by the supporting member 4 as shown in FIGS. 1A and 1B. Therefore, the cantilever arm 5 or the top electrode 6 may be modified due to thermal expansion while manufacturing the MEMS switch or operating the MEMS switch.

FIG. 2B shows the cantilever arm 5 with the contact member 7 of the conventional MEMS switch, which is modified due to the thermal expansion. As shown in FIG. 2B, other end of the cantilever arm 5 is not parallel to the signal lines 3 while the cantilever arm 5 moves upwardly and downwardly. Therefore, the cantilever arm 5 is unstably operated. Such an unstable operation of the cantilever arm 5 causes the loose contact that increases contact resistance of the signal line 3 and decreases the reliability by making the flow of the signal to be unstable.

Figure 3:
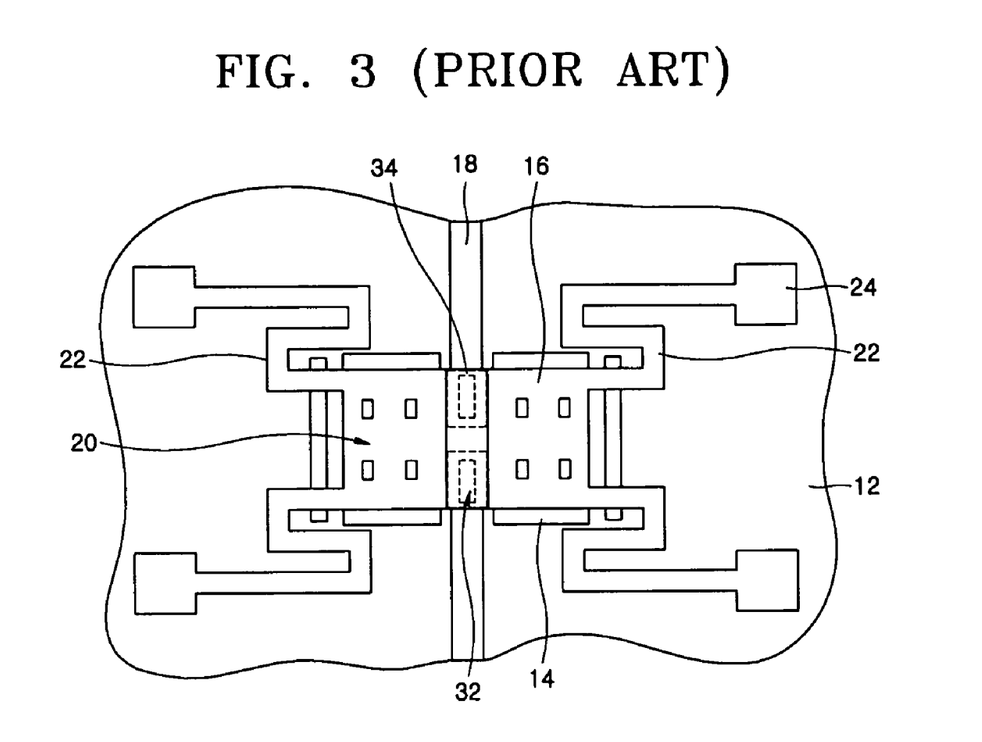
FIG. 3 is a plan view of a conventional MEMS switch having a membrane structure.

FIG. 3 is a plan view of a conventional MEMS switch having a membrane structure.

Referring to FIG. 3, the conventional MEMS switch having the membrane structure includes a substrate 12 having a supporting member 24, a bottom electrode 14 and a signal line 18 having an opened portion, and a moving plate 20 disposed to be separated from the substrate at a predetermined gap and supported by the supporting member 24. The moving plate 20 includes a top electrode 16 and is supported by the supporting members 24 through springs 22 to have the elasticity in both sides of the signal line 18. Meanwhile, a connecting member 34 connecting the signal line 18 is formed on the bottom of the moving plate 20. A contact member 32 is formed on the connecting member 34 to be projected in a downward direction to contact the signal line 18. The moving plate 20 includes a plurality of small rectangles which are holes formed to eliminate a sacrificial layer.

If a predetermined level of a driving voltage is supplied to the bottom electrode 14 and the top electrode 16, the moving plate 20 moves in a downward direction by the electrostatic force generated between the bottom electrode 14 and the top electrode 16. Accordingly, the connecting member 34 disposed on the bottom of the moving plate 20 connects disconnected portions of the signal line 18 to perform the switching operation. Such a conventional MEMS switch having the membrane structure was disclosed in U.S. Pat. No. 6,307,452.

In the switch having the membrane structure, the signal line 18 and the supporting member 24 are separated with a comparatively long distance. Therefore, the surface of the top electrode 16 may be modified by the thermal expansion while manufacturing the switch or operating the switch. Such a modification of the surface may cause the open problem which permanently opens the moving plate 20 and the signal line 18 not to be contacted. Or, the modification of the surface may cause the stiction problem which narrows the top electrode 16 and the bottom electrode 14 to be connected one another. Such problems degrade the stability and the reliability of the MEMS switch.

If the moving plate 20 and the spring are modified by the thermal expansion, the moving plate 20 cannot maintain to be parallel to the substrate 12 when the moving plate 20 moves. It is because that the supporting member 24 is fixed at the substrate 12 having less thermal expansion rate than the moving plate 20. That is, the moving plate 20 is extremely expanded while the distance between the supporting members 24 is not changed. Such a thermal expansion generates a great stress on the connecting portion between the moving plate 20 and the spring 22, and it modifies the connecting portion, permanently. Finally, the moving plate 20 is abnormally apart from the substrate 12, or the moving palate is titled to one side according to the modification of the moving plate 20 so that the MEMS switch cannot be operated, normally. If the moving plate 20 is lowered to be close to the substrate 12, the connecting member 34 of the moving plate 20 is contacted to the signal line 18, permanently.

Furthermore, the stiction problem is easily occurred because the positive electrode is maintained within an extremely short distance, i.e., several micrometers, to generate the electrostatic force. That is, the moving plate 20 or the spring 22 is easily attached to near fixed other parts. Such a stiction problem is the major factor degrading the reliability of the switch.

As described above, the conventional MEMS switches having the cantilever or the membrane structure have low reliability and low signal isolation characteristics caused by the structural problems such as the thermal expansion and the stiction problem although the conventional MEMS switches are introduced to overcome drawbacks of the conventional semiconductor switches such as high insertion loss, low signal isolation and signal distortion. Therefore, there are great demands for developing a MEMS switch having new structure to overcome such problems.

SUMMARY OF THE INVENTION

The present invention provides a MEMS switch driven by electrostatic force to overcome the thermal expansion and the stiction problem caused by the structural problem of MEMS switch and a method of manufacturing the same.

According to an aspect of the present invention, there is provided a MEMS (micro-electro mechanical systems) switch including; a substrate including a trench, a ground line and a signal line having an opening portion; a moving plate separated from the substrate at a predetermined space and including a contacting member for connecting the opened portion of an electrode plate and a deep corrugate to be inserted into the trench; and a supporting member for supporting the moving plate.

The trench, the ground line and the signal line may be formed to be separated one another at a predetermined distance in a first direction of the substrate, and the supporting member is formed at least one of portions at both ends of the substrate in a vertical direction from the first direction. And, the signal line may be formed on the center of the substrate, the supporting member may be formed at both ends of the substrate, the ground line may be formed between the signal line and the supporting member, and the trench may be formed between the supporting member and the ground line and between the signal line and the ground line.

The MEMS switch according to the present invention solves the structural problem of the cantilever structure and the membrane structure using the trench formed on the substrate and the deep corrugate formed on the moving plate. That is, the MEMS switch according to the present invention is less sensitive to the thermal expansion generated while manufacturing and operating the MEMS switch and is stably operated through overcoming the stiction problem of the membrane structure.

According to another aspect of the present invention, there is provided a method of manufacturing a MEMS (micro-electro mechanical systems) switch including: forming a trench, a ground line and a signal line having an opening portion on a substrate in a first direction; forming a supporting metal at least one of position at both ends of the substrate in a vertical direction from the first direction; forming a sacrificial layer having a predetermined thickness on the entire surface of the substrate after forming the supporting metal; forming a moving plate including an electrode layer connected to the supporting metal on the sacrificial layer and a contacting member for connecting the opening portion; and removing the sacrificial layer.

The forming of the sacrificial layer may include exposing a predetermined portion of the ground line and the supporting metal by etching the sacrificial layer, and the forming of the moving plate may include: forming an insulating layer on the entire surface of the substrate after exposing; forming an contacting member by etching the insulating layer and the sacrificial layer at both ends of the signal line of the opening portion and burying a conductive material; and forming a switching electrode line by forming an electrode layer on the insulating layer and the contacting member and etching a predetermined portion around the electrode layer on the contacting member.

The MEMS switch according to the present invention includes the deep corrugate formed on the moving plate for constraining the thermal expansion of the moving plate and for improving the reliability. Also, the MEMS switch according to the present invention includes the supporting protrusion formed on the center of the moving plate to be projected to the ground line for separating the moving plate from the substrate at a predetermined space so as to stable make a contact between the contact member and the signal line. Therefore, the reliability is improved.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will be described more fully hereinafter with reference to the accompanying drawings in while preferred embodiments of the invention are shown. This invention may, however, be embodied in many different forms and should not be construed as being limited to the embodiments set forth herein. Rather, these embodiments are provided so that this disclosure will be through and complete, and will fully convey the scope of the invention to those skilled in the art. In the drawings, the forms of elements are exaggerated for clarity. To facilitate understanding, identical reference numerals have been used, where possible, to designate identical elements that are common to the figures.

Figure 4A:
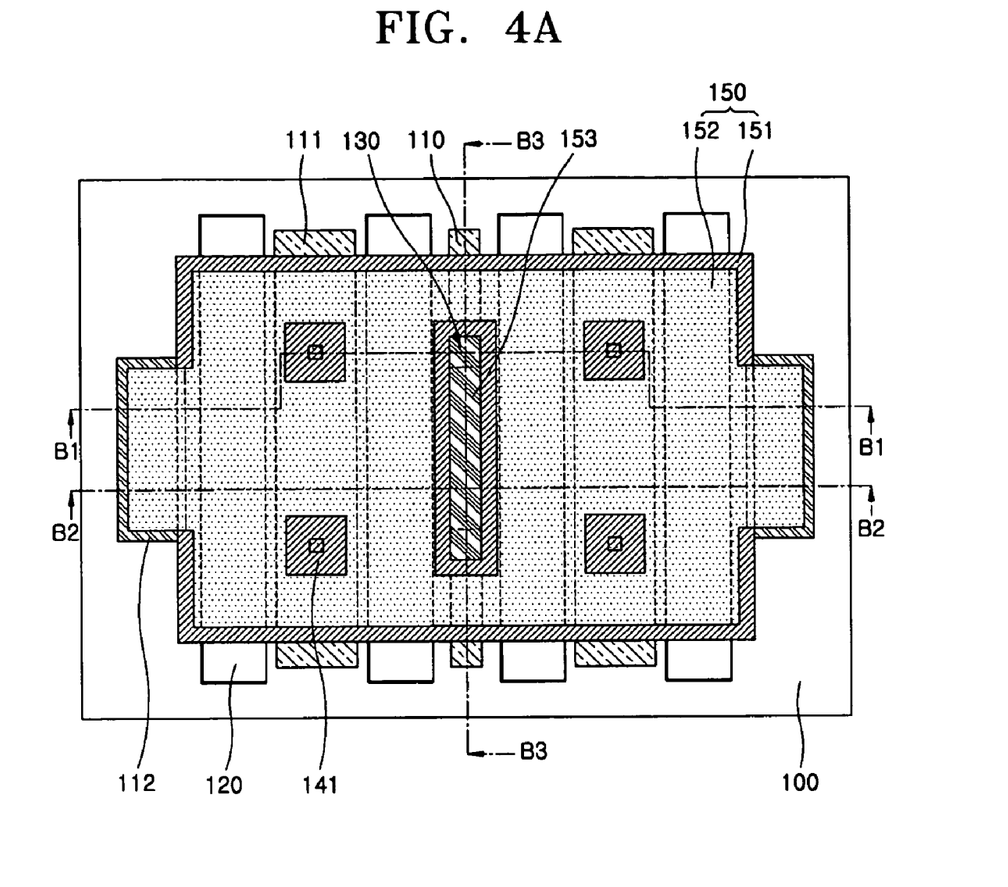
FIG. 4A is a plan view of a MEMS switch according to an embodiment of the present invention.
Figure 4B:
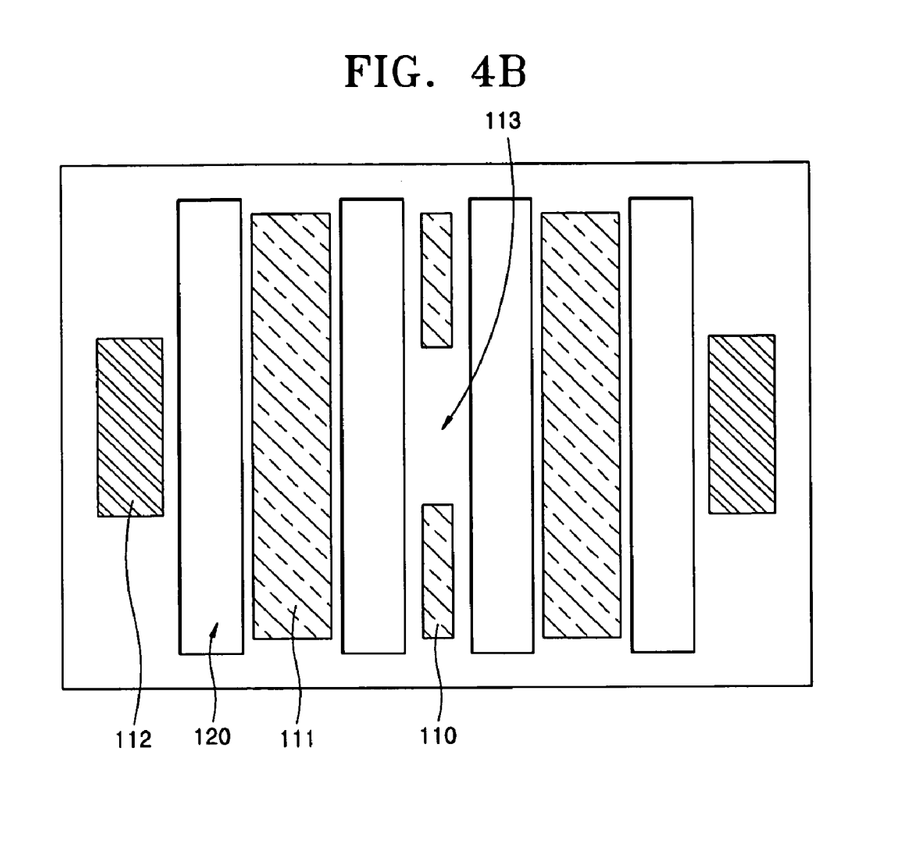
FIG. 4B is a plan view of the MEMS switch without the moving plate shown in FIG. 4A.

FIGS. 4A and 4B are a plan view of a MEMS switch according to an embodiment of the present invention. Herein, FIG. 4B is a plan view of the MEMS switch shown in FIG. 4A without the moving plate.

Referring to FIGS. 4A and 4B, the MEMS switch according to the present embodiment includes: a substrate 100 having a trench 120, a signal line 110 and a ground line 111; a supporting member 112 formed at both ends of the substrate 100; and a moving plate 150 supported by the supporting member 112, separated from the substrate 100 at a predetermined space and having a deep corrugate (not shown).

The substrate 100 may be a semiconductor substrate or a dielectric substrate. The signal line 110 is an input/output signal line for a signal flow and has an opened portion 113 that is a disconnected portion of the signal line 110. The ground line 111 is formed on the substrate 100 at both sides of the signal line 110 to be parallel to the signal line 110. The supporting member 112 formed on both ends of the substrate 100 is a supporting metal 112 formed of metal for supplying a voltage to the electrode plate 152 of the moving plate 150. In the present embodiment, the shown MEMS switch is a symmetric switch having the supporting members 112 at both ends of the substrate 100. However, the supporting member 112 may be formed on one end of the substrate 110, and the signal line 110 may be formed on other end of the substrate 100.

A rectangular trench is formed on the substrate 100 between the signal line 110 and the ground line 111, and the ground line 111 and the supporting member 112 to be parallel to the signal line 110. The trench 120 is formed to be a predetermined depth through a semiconductor etching process. In the present embodiment, the MEMS switch includes the two ground lines 111 and the four trenches 120. However, the present invention is not limited by the number of the ground lines and the trenches.

The moving plate 150 includes an electrode plate 152 for supplying a voltage, an insulating layer 151 formed on a bottom of the electrode plate 152 for preventing the electrode plate 152 from being shorted from the ground line 111, and a contact member 130 formed on a center portion of the moving plate 150 for connecting the opened portion 113 of the signal line 110. By the supporting member 112 and the supporting protrusion 141, the moving plate 150 is supported to be separated from_the substrate 100 at a predetermined space and includes a deep corrugate to be inserted into the trench 120. The contact member 130 is projected at each ends of the signal line 110 of the opened portion 113 to connect them, and is connected to a switching electrode line 153 which is electrically isolated from the electrode plate 152.

The electrode plate 152 and the insulating layer 151 are formed of a material having elasticity so that the moving plate 150 moves in the upward direction and the downward direction with the elastic restoring force. A plurality of holes (not shown) is formed on the entire surface of the moving plate 150 for eliminating a sacrificial layer.

The supporting protrusions 141 are formed on four places of the ground line 111 to have a wedge shaped groove and to have a predetermined height. Such supporting protrusions 141 are formed using the insulating layer 151 of the moving plate 150. The electrostatic force supplied to the supporting protrusions 141 is minimized by eliminating the electrode plate 152 at the supporting protrusions 141.

The wedge shaped groove supporting protrusion 141 constrains the ground line 111 and the moving plate 150 from being shorted. Therefore, the wedge shaped groove supporting protrusion 141 improves these following characteristics.

Generally, the moving plate 150 is formed using the sacrificial layer and the sacrificial layer is eliminated after forming the moving plate 150. The supporting protrusion 141 restrains the residual stress created at the moving plate 150 after eliminating the sacrificial layer and results in standardizing a driving voltage and to improve the reliability. That is, if the sacrificial layer is removed, the residual stress generated by a difference of tensile force of matters to compose the moving plate bands the moving plate and varies the driving voltage when the MEMS switch is operated. Such a variation of driving voltage reduces the reliability. Therefore, the supporting protrusion 141 restrains the residual stress to improve the reliability of the MEMS switch.

When the moving plate 150 moves in response to a control signal of a driving part, the supporting protrusion 141 prevents the moving plate 150 and the ground line 113 from being shorted. That is, the supporting protrusion 141 supports the moving plate 150 not to be fail while the moving plate moves numerous times for switching.

In the present embodiment, the four supporting protrusions 141 are formed. However, more or less supporting protrusions 141 may be formed to prevent the residual stress of the moving plate 150 and to prevent the shorting.

Figure 5A:
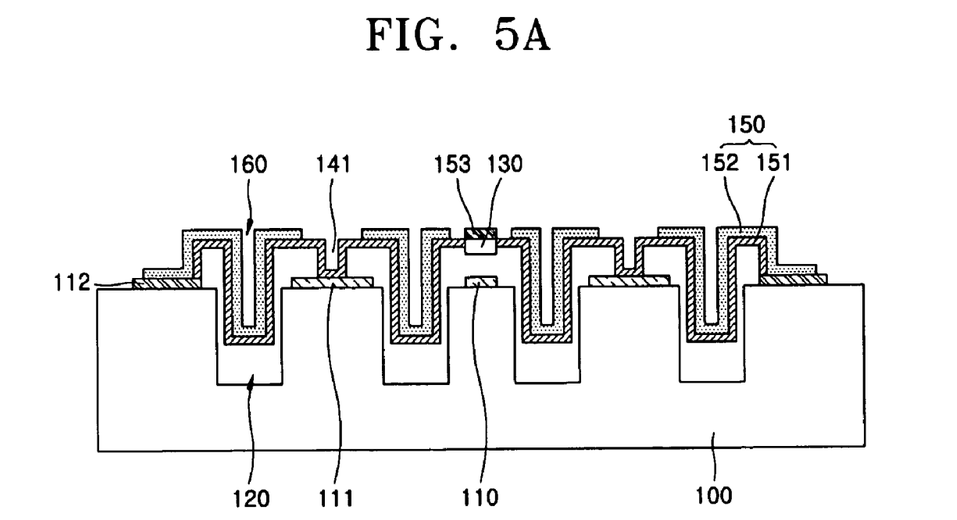
FIGS. 5A and 5B are cross-sectional view of the MEMS switch of FIG. 4A taken along the line B1-B1.
Figure 5B:
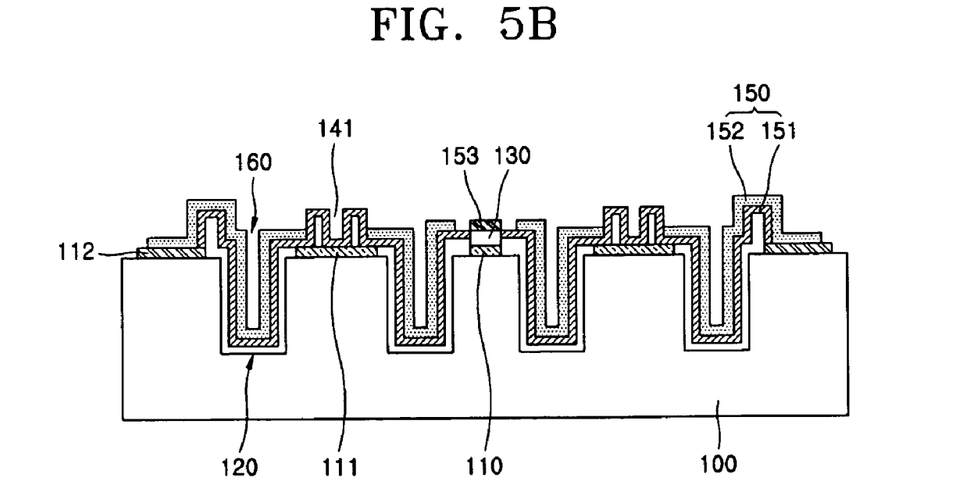

FIGS. 5A and 5B are cross-sectional view of the MEMS switch of FIG. 4A taken along the line B1-B1. That is, FIG. 5A shows an OFF-state when the voltage is not supplied between the ground line 111 and the electrode plate 152 and FIG. 5B shows an ON-state.

Referring to FIG. 5A, the supporting members 112 at both ends and the supporting protrusion 141 at the center portion support the moving plate 150 with a predetermined height. That is, the moving plate 150 is separated from the substrate 100 at a predetermined space. Also, the moving plate 150 includes the deep corrugate 160 to be inserted into the trench 120. The deep corrugate 160 is formed throughout the electrode plate 152 and the insulating layer 151 configuring the moving plate 150. The contact member 130 is projected in the bottom direction passing through the insulating layer 151 and connected to the switching electrode line 153.

FIG. 5B shows the ON-state when the voltage is supplied into between the ground line and the electrode plate. If a predetermined level of direct current (DC) driving voltage is supplied to the electrode plate 152 that is used as the top electrode and the ground line 111 used as the bottom electrode, the attractive force is generated between the electrode plate 152 and the ground line 111 due to the electrostatic force. Herein, since the ground line 111 is fixed at the substrate 100, the moving plate 150 having the elastic force bends toward the ground line 111. The bended moving plate 150 connects the contact member 130 and the signal line 110 to flow the signal.

Since the insulating layer 151 is formed under the electrode plate 152, the electrical short of the ground line 111 and the electrode plate 152 is prevented. If the voltage is interrupted to be supplied, the MEMS switch returns to the OFF state show in FIG. 5A due to the elastic restoring force of the moving plate 150.

The MEMS switch having the deep corrugate 160 may maximally restrain the thermal expansion of the moving plate 150 while eliminating the sacrificial layer (not shown) and performing the switch operation due to the unique three-dimensional shape. Therefore, the MEMS switch according to the present invention has superior reliability. Also, the MEMS switch according to the present invention can be operated in low driving voltage compared to the conventional MEMS switch because the spring constant of the moving plate 150 having the deep corrugate is comparatively smaller than that of the conventional MEMS switch.

Since the moving plate of the conventional MEMS switch is fixed at both sides of substrate, the moving plate was easily thermally modified. Also, the stiction problem is easily generated due to the small gap between the moving plate and the ground line. As described above, the stiction problem is that the moving plate used as the top electrode is attached to other parts of the switch. Such a stiction problem is caused by the moisture and the foreign element between the moving plate and the substrate which are separated within a several micrometers. The stiction problem may be a major factor to un-stabilize the switching characteristics of the switch. Therefore, the supporting protrusion 141 is formed on the moving plate 150 to standardize the operating voltage and to prevent the stiction in the present embodiment.

Figure 6A:
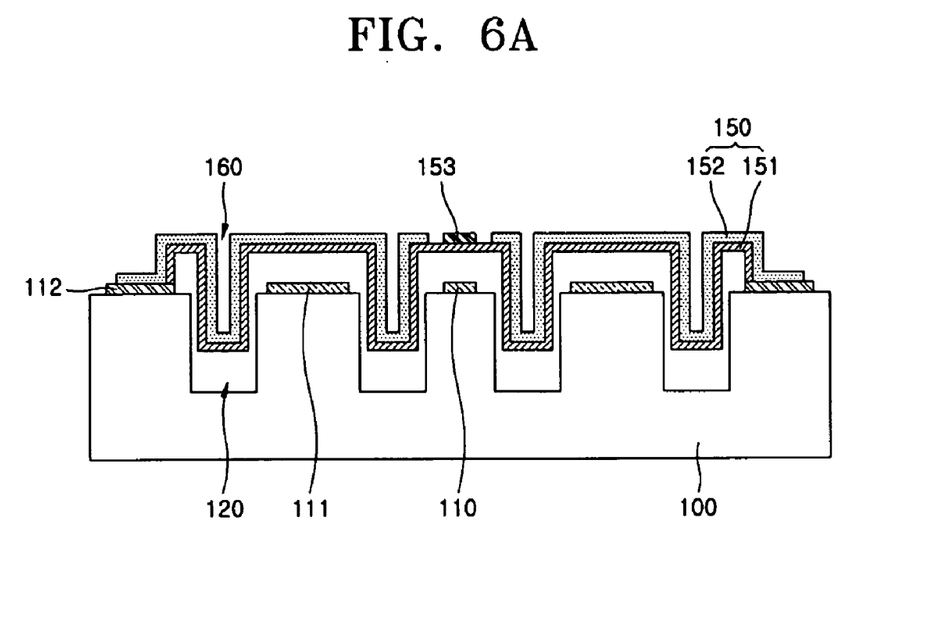
FIGS. 6A and 6B are cross-sectional view of the MEMS switch of FIG. 4A taken along the line B2-B2.
Figure 6B:
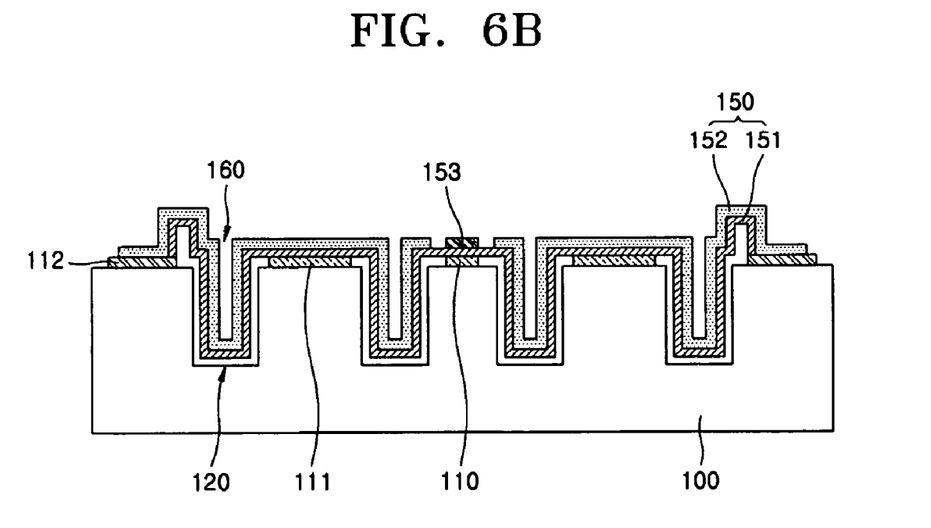

FIGS. 6A and 6B are cross-sectional view of the MEMS switch of FIG. 4A taken along the line B2-B2. Those drawings show a portion of the MEMS switch shown in FIG. 4A where the supporting protrusion 141 is not shown to help understanding the present invention easier.

FIG. 6A shows the MEMS switch when the voltage is not supplied so it is similar to the MEMS switch shown in FIG. 5A. That is, the supporting protrusion 141 and the contact member 130 are not shown. FIG. 6B shows the MEMS switch when the voltage is supplied. As shown in FIG. 6B, the moving plate 150 is almost attached to the substrate 100.

Figure 7A:
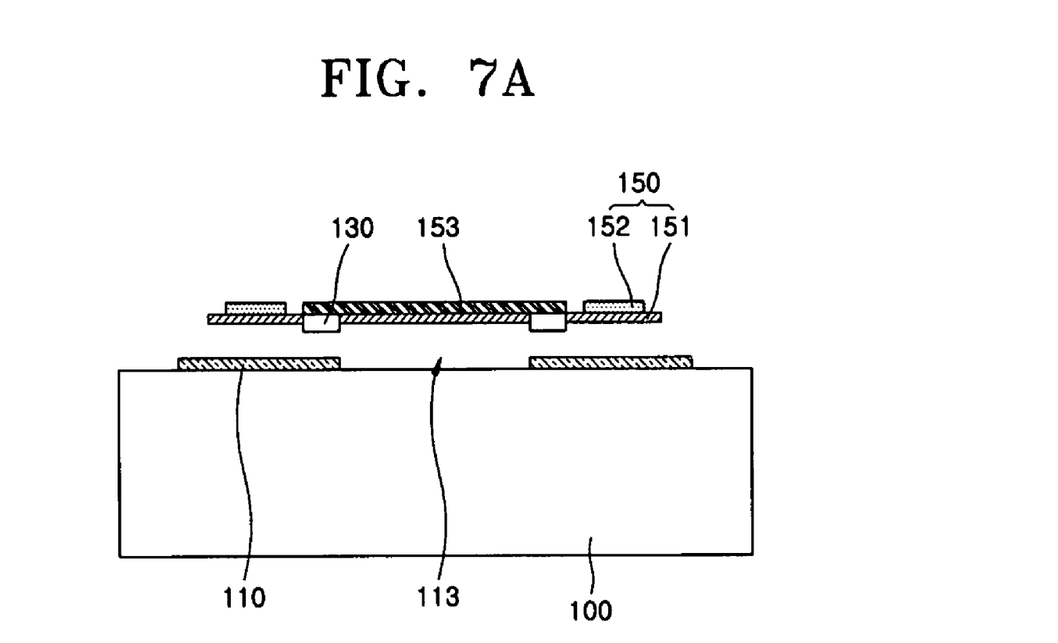
FIGS. 7A and 7B are cross-sectional view of the MEMS switch of FIG. 4A taken along the line B3-B3.
Figure 7B:
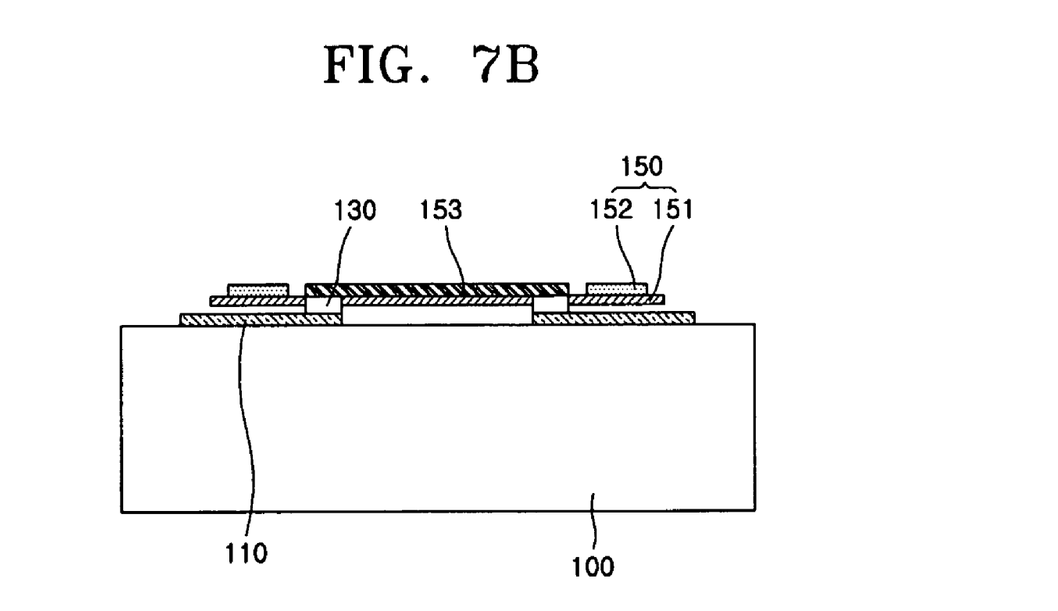

FIGS. 7A and 7B are cross-sectional view of the MEMS switch of FIG. 4A taken along the line B3-B3. These drawings show a portion of the MEMS switch where the contact member 130 is formed in detail. FIG. 7A shows the MEMS switch when the voltage is not supplied and FIG. 7B shows the MEMS switch when the voltage is supplied.

Referring to FIG. 7A, the moving plate 150 is separated from the substrate 100 at a predetermined space because the voltage is not supplied. Therefore, the signal is interrupted to flow along the signal line 110 because of the opened portion 113. In the present embodiment, the contact member 130 is formed to be projected passing through the insulating layer 151 so as to connect to the top switch electrode line 153. However, the contact member 130 and the switching electrode line 153 may be formed under the insulating layer 151.

If the voltage is supplied as shown in FIG. 7B, the moving plate 150 moves to be near the substrate 100. Accordingly, the contact member 130 contacts to the signal line 110 to flow the signal through the switching electrode line 153. If the voltage is interrupted after then, the moving plate 150 moves in the upward direction due to the elastic restoring force. Accordingly, the signal line 110 is opened again. As a result, the signal flow is interrupted.

Figure 8A:
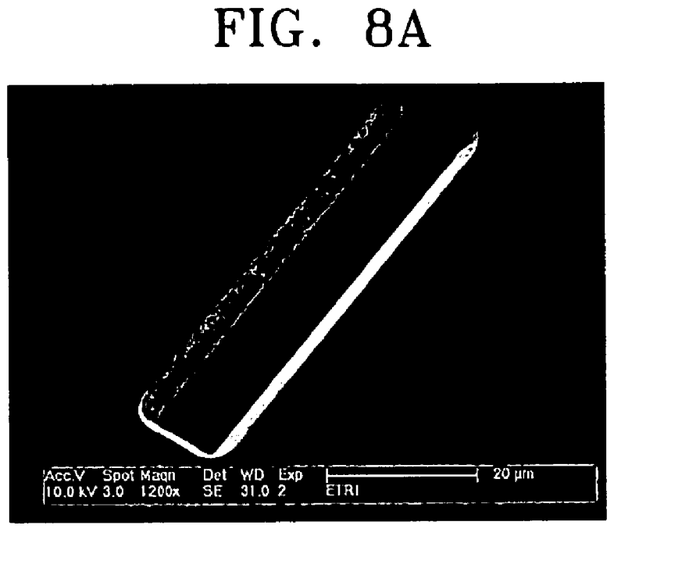
FIGS. 8A and 8B are picture showing a MEMS switch with a trench according to an embodiment of the present invention.
Figure 8B:
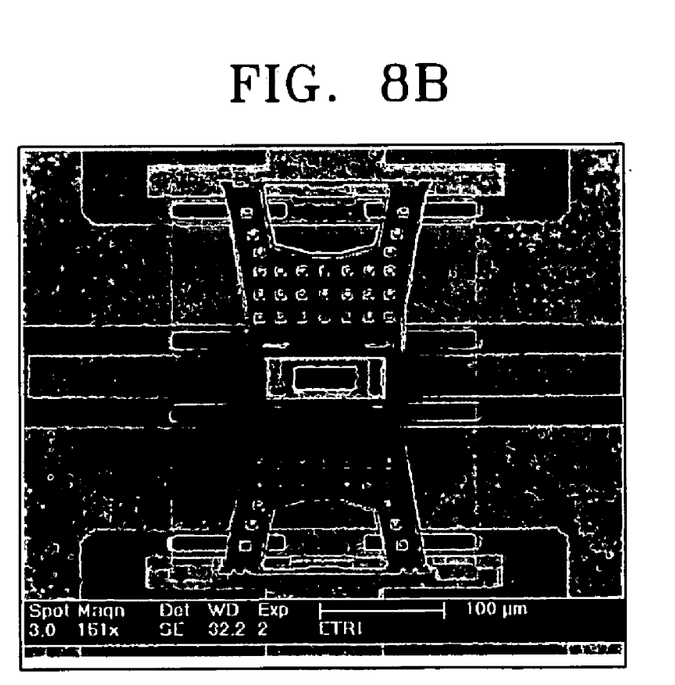

FIGS. 8A and 8B are pictures showing a MEMS switch with a trench according to an embodiment of the present invention.

Referring to FIG. 8A, the rectangular trench 120 may be formed between the signal line 110 and the ground line 111, and the supporting member 112 and the ground line 111. The trench 120 is formed to have a predetermined depth through a semiconductor etching process.

Referring to FIG. 8B, the MEMS switch according to the present invention is a single pole single throw (SPST) structure. That is, the MEMS switch according to the present invention has single input/output signal line 110. However, the MEMS switch according to the present invention is not limited by the SPST structure. That is, the MEMS switch according to the present invention may be applied to switches having various structures including the single pole multi throw (SPMT) structure. Herein, small rectangles are holes formed to eliminate the sacrificial layer.

FIGS. 9A through 9F are cross-sectional views of a MEMS switch for describing a method of fabricating the MEMS switch according to an embodiment of the present invention.

Figure 9A:
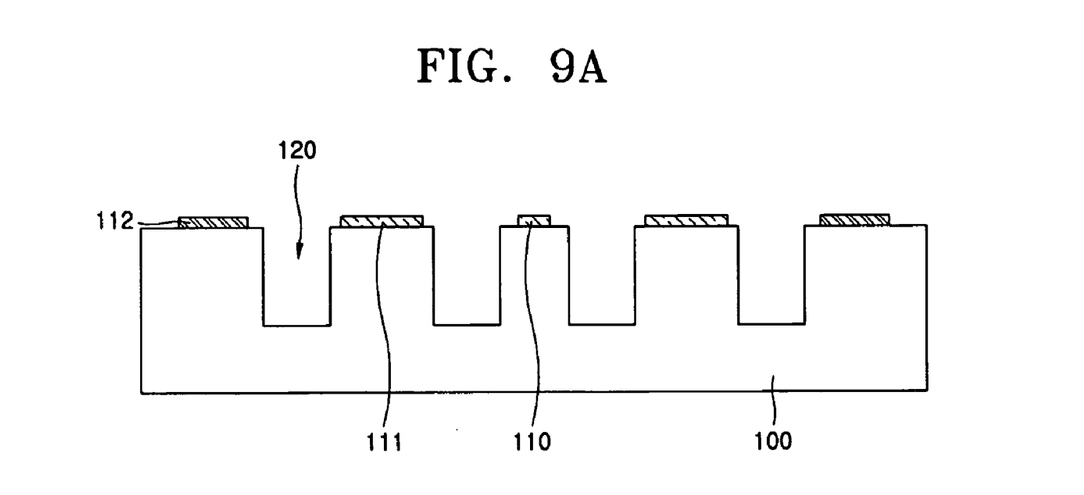
FIGS. 9A through 9F are cross-sectional views of a MEMS switch for describing a method of fabricating the MEMS switch according to an embodiment of the present invention.

Referring to FIG. 9A, a trench 120, a supporting metal 112, a ground line 111 and a signal line having an opened portion are formed on a substrate 100 in a first direction. The supporting metal 112 is formed on the both ends of the substrate 100, and the signal line 110 is formed on a center portion of the substrate 100. Then, the ground line 111 is formed between the signal line 110 and the supporting metal 112 as the bottom electrode of driving element. Meanwhile, trenches 120 are formed between the supporting metal 112 and the ground line 111 and the signal line 110 and the ground line 111.

In the present embodiment, the MEMS switch has a symmetric structure. However, the supporting metal 112 may be formed at one end of the substrate and the signal line may be formed on other end of the substrate. The number of ground lines 111 and the trenches 120 may be controlled according to the characteristics of the moving plate.

Figure 9B:
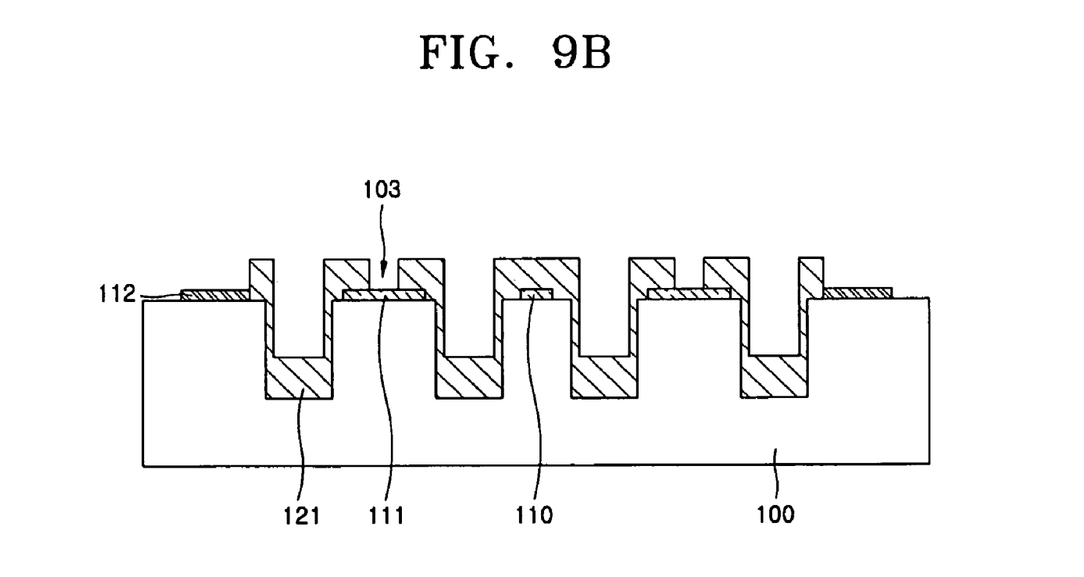

Referring to FIG. 9B, a predetermined thickness of a sacrificial layer 121 is formed where the trench 120, the supporting metal 112, the ground line 111 and the signal line 110 are formed. For example, when about 2 μm of the sacrificial layer is formed on the entire surface of the substrate_using a spin coating, about 3 μm of sacrificial layer is formed on the bottom surface of the trench and a thinner sacrificial layer is formed on both sidewalls of the trench. After forming the sacrificial layer 121, a predetermined portion of the supporting metal 112 and the ground line 111 are opened through the etching. Later, the supporting protrusion is formed on the opened portion 103 of the ground line 111.

Figure 9C:
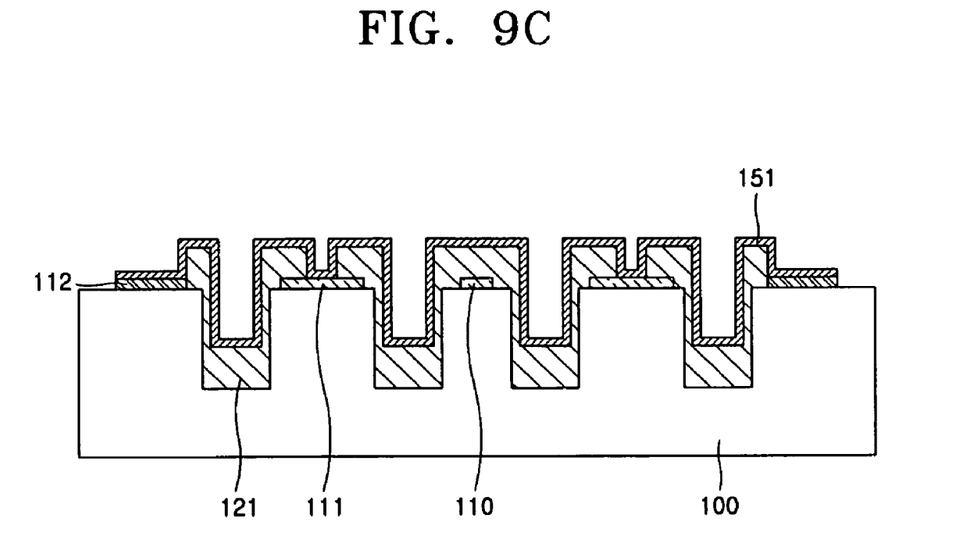

Referring to FIG. 9C, an insulating layer 151 is formed on the entire substrate after exposing the supporting metal 112 and the ground line 111. The insulating layer 151 prevents the electrode layer, which is formed later, from being shorted from the ground line 111 or the signal line 110. Meanwhile, a plurality of holes is formed on the entire insulating layer 151 to eliminate the sacrificial layer 121.

Figure 9D:
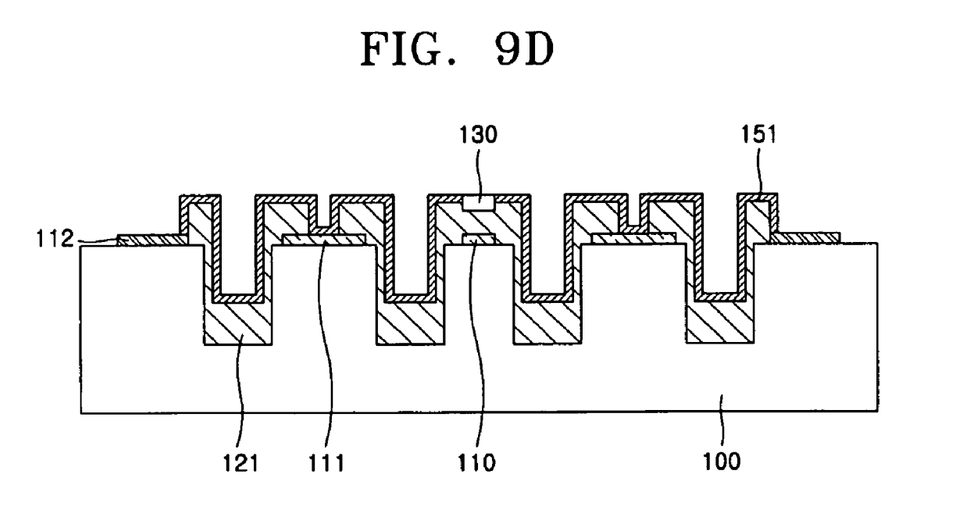

Referring to FIG. 9D, the supporting metal 112 is exposed through etching a predetermined portion of the insulating layer 151, and a contact member 130 is formed at a predetermined potion of the both ends of the exposed portion of the signal line 110. The contact member 130 is formed to be projected to the bottom of the insulating layer 151 by etching the insulating layer 151 and a predetermined portion of top layer of the sacrificial layer 121 and burying the conductive material on the etched portion.

Figure 9E:
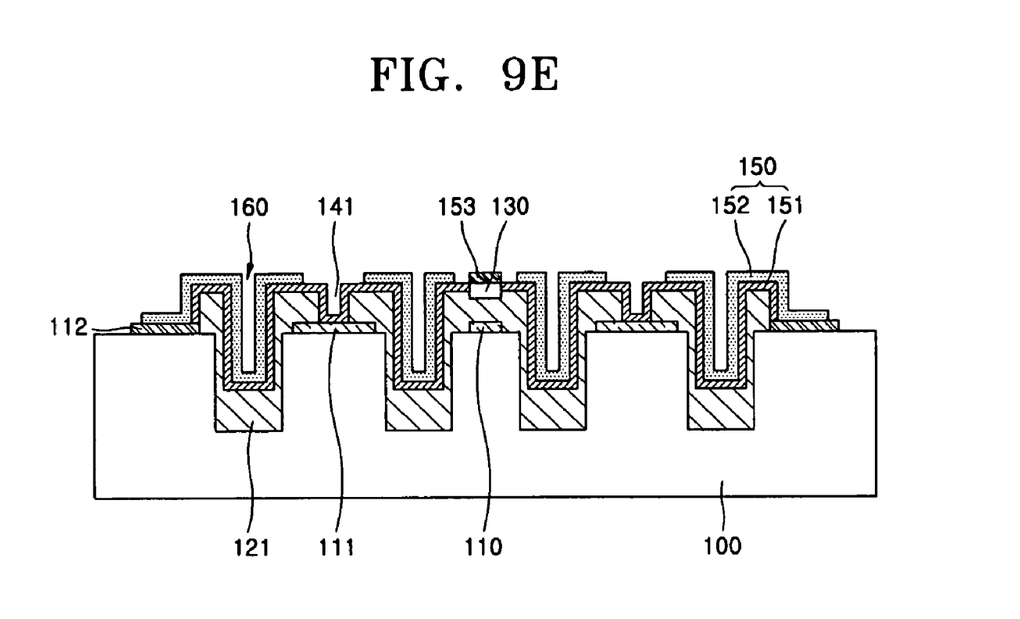

Referring to FIG. 9E, an electrode layer 152 is formed on the entire substrate after forming the contact member 130, and a moving plate 150 configured of the insulating layer 151 and the electrode layer 152 is formed. A deep corrugate 160 is formed at a predetermined portion of the moving plate 150 where the trench 120 is formed.

Then, a switching electrode line 153 is formed to be electrically isolated from the electrode layer 152 by etching a predetermined portion of the electrode layer around the contact member 130. When the switching electrode line 153 is formed, the electrode layer 152 formed on the insulation layer 151 of the exposed ground line 111 is removed, and the supporting protrusion 141 is formed on the removed portion. It is because to maximally reduce the attractive force generated by the electrostatic force at the supporting protrusion 141. Meanwhile, a plurality of holes (not shown) is formed on the electrode layer to be matched to the plurality of holes formed on the insulating layer 151.

In order to control the radio frequency signal flowing through the signal line 110, the moving directions of the switching line 153 must be identical to that of the moving plate 150. Therefore, the electrode layer 152 and the switching electrode layer 153 must be formed to be located on the same plane using identical material. Also, the switching electrode line 153 must be isolated from the electrode layer 152 so as to electrically insulate the switching electrode line 153 when the voltage is supplied to the electrode plate 152.

Figure 9F:
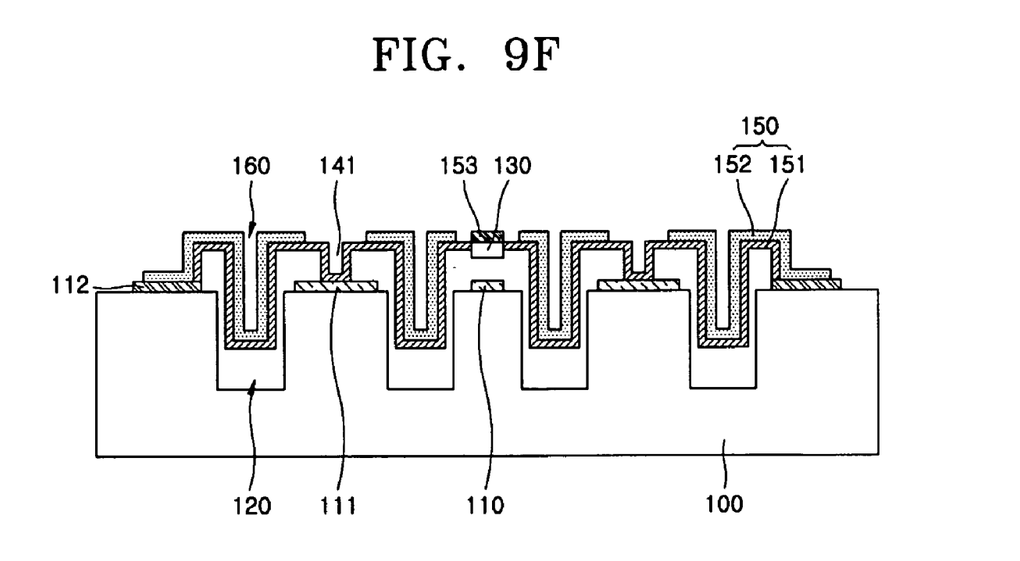

Referring to FIG. 9F, the sacrificial layer 121 between the moving plate 150 and the substrate 100 is removed. The sacrificial layer 121 is removed using the plurality of holes (not shown) formed on the moving plate 150. The moving plate 150 can move in the upward and the downward directions to be separated from the substrate at a predetermined space by eliminating the sacrificial layer 121. Meanwhile, the moving plate 150 is supported to be separated from the substrate 100 at a predetermined space by the supporting metal 112 connected to the both sides of moving plate 150 and by the supporting protrusion 141.

Since the moving plate 150 has a wide area, the center portion thereof where is comparatively far from the supporting metal 112 may be easily modified without supplying the voltage. Therefore, the trench 120 is formed on the substrate 100 and the deep corrugate 160 is formed on the moving plate 150 to be inserted into the trench 120 in the present invention. Therefore, the thermal expansion of the moving plate 150 is constrained without modifying the unique spring constant of the moving plate 150. The deep corrugate 160 may be formed on several positions of the moving plate 150 to improve the reliability of the moving plate 150 to move in the upward and the downward directions. Also, the wedge shaped supporting protrusion 141 is formed on the ground line according to the present invention. Therefore, the stiction created between the moving plate and the ground line is prevented, and the reliability and the stability are improved.

The MEMS switch according to the present invention constrains the thermal expansion of the moving plate and improves the reliability by forming the deep corrugate on the moving plate and forming the supporting protrusion on the center portion of the moving plate to separate the moving pate from the substrate at a predetermined space. Therefore, the contact member and the signal line are stably contacted so the reliability thereof improves.

Furthermore, defectives generated during the manufacturing process is minimized due to the stable structure of the present invention, and the method of forming the MEMS switch according to the present invention is comparatively simple and convenience. Therefore, the manufacturing yield thereof is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A MEMS (micro-electro mechanical systems) switch comprising;
   a substrate including a plurality of trenches, a ground line and a signal line having an opened portion;
   a moving plate separated from the substrate at a predetermined space and including an electrode plate, a contact member for connecting the opened portion and a plurality of deep corrugates, wherein each deep corrugate is to be inserted into a respective trench of the plurality of trenches, each deep corrugate comprising a respective insulating layer and a respective electrode plate, and a groove is formed at each deep corrugate; and
   a supporting member for supporting the moving plate.

2. The MEMS switch of claim 1, wherein each trench of the plurality of trenches, the ground line and the signal line are formed to be separated one another at a predetermined distance in a first direction of the substrate, and
   the supporting member is formed in at least one of portions at both ends of the substrate in a vertical direction from the first direction.

3. The MEMS switch of claim 2, wherein the signal line is formed on the center of the substrate,
   the supporting member is formed at both ends of the substrate,
   the ground line is formed between the signal line and the supporting member, and
   each trench of the plurality of trenches is formed between the supporting member and the ground line and between the signal line and the ground line.

4. The MEMS switch of claim 1, wherein the supporting member is a supporting metal formed on the substrate and electrically connected to the electrode plate.

5. The MEMS switch of claim 1, wherein the moving plate further includes a supporting protrusion formed on the ground line and supporting the moving plate to be separated from the substrate at a predetermined space.

6. The MEMS switch of claim 5, wherein the supporting protrusion includes a wedge shape groove inside thereof.

7. The MEMS switch of claim 1, wherein the moving plate includes an insulating layer on the bottom of the electrode plate to prevent the ground line from being shorted.

8. The MEMS switch of claim 7, wherein a conductive switching line electrically isolated from the electrode plate is formed on the insulating layer above the opened portion, and
   the contact member is connected to the conductive switching line and is projected by passing through a predetermined position of the insulating layer where the contact member contacts the both ends of the opened portion of the signal line.

9. The MEMS switch of claim 1, wherein an insulating layer is formed on the ground line.

10. The MEMS switch of claim 1, wherein the moving plate is made of material having elastic restoring force to move in the upward direction and the downward direction.

11. The MEMS switch of claim 10, wherein the ground line is a first electrode, the electrode plate is a second electrode, and the signal line of the opened portion contacts to the contact member by electrostatic attractive force generated from the ground line and the electrode plate when the voltage is supplied to the first and the second electrodes.

12. A method of manufacturing a MEMS (micro-electro mechanical systems) switch comprising:

forming a plurality of trenches, a ground line and a signal line having an opened portion on a substrate in a first direction;

forming a supporting member in at least one of both ends of the substrate in a vertical direction from the first direction;

forming a sacrificial layer having a predetermined thickness on the entire surface of the substrate after forming the supporting member;

forming a moving plate having an electrode layer connected to the supporting member on the sacrificial layer and a contact member for connecting the opened portion, wherein forming the moving plate includes forming an insulating layer on the entire surface of the substrate;

removing the sacrificial layer; and wherein after removing the sacrificial layer, the moving plate forms a respective deep corrugate above each of the plurality of trenches, each respective deep corrugate including the insulating layer and the electrode layer, and a groove is formed at each deep corrugate.

13. The method of claim 12, wherein the signal line is formed on the center of the substrate, the supporting member is formed at both ends of the substrate, the ground line is formed between the signal line and the supporting member, and each trench of the plurality of trenches is formed between the supporting member and the ground line and between the signal line and the ground line.

14. The method of claim 12, wherein the forming of the sacrificial layer includes exposing a predetermined portion of the ground line and the supporting member by etching the sacrificial layer.

15. The method of claim 14, wherein the forming of the moving plate further includes:

forming the insulating layer on the entire surface of the substrate after exposing;

forming an contact member by etching the insulating layer and the sacrificial layer at both ends of the signal line of the opened portion and burying a conductive material; and forming a switching electrode line by forming an electrode layer on the insulating layer and the contact member and etching a predetermined portion around the electrode layer on the contact member.

16. The method of claim 15, wherein in the etching of the insulating layer and the sacrificial layer, the insulating layer is exposed through etching the insulating layer on the supporting member.

17. The method of claim 15, wherein the forming of the switching electrode line, a supporting protrusion is formed through etching the electrode layer formed on the insulating layer of the predetermined portion of the ground line.

18. The method of claim 12, wherein the moving plate is formed of materials having elastic restoring force.

* * * * *